(12) United States Patent
Suzuki

(10) Patent No.: US 10,565,905 B2
(45) Date of Patent: Feb. 18, 2020

(54) LIGHT-EMISSION UNIT AND DISPLAY

(71) Applicant: SONY CORPORATION, Tokyo (JP)

(72) Inventor: Mamoru Suzuki, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/779,956

(22) PCT Filed: Dec. 8, 2016

(86) PCT No.: PCT/JP2016/086619
§ 371 (c)(1),
(2) Date: May 30, 2018

(87) PCT Pub. No.: WO2017/104547
PCT Pub. Date: Jun. 22, 2017

(65) Prior Publication Data
US 2018/0357940 A1    Dec. 13, 2018

(30) Foreign Application Priority Data

Dec. 18, 2015   (JP) ................. 2015-247658

(51) Int. Cl.
| H01L 33/54 | (2010.01) |
| G09F 9/33 | (2006.01) |
| G02B 19/00 | (2006.01) |
| H01L 33/60 | (2010.01) |
| F21Y 115/10 | (2016.01) |

(52) U.S. Cl.
CPC ........... *G09F 9/33* (2013.01); *G02B 19/0028* (2013.01); *G02B 19/0061* (2013.01); *H01L 33/54* (2013.01); *F21Y 2115/10* (2016.08); *H01L 33/60* (2013.01)

(58) Field of Classification Search
CPC ... G09F 9/33; G02B 19/0028; G02B 19/0061; H01L 33/54
See application file for complete search history.

(56) References Cited

U.S. PATENT DOCUMENTS

| 6,778,574 B1* | 8/2004 | Shimonaka | H01S 5/02228 372/108 |
| 7,349,159 B2* | 3/2008 | Shimizu | G02B 3/0031 359/619 |
| 9,276,178 B2* | 3/2016 | Tischler | H01L 27/14 |
| 9,329,455 B2* | 5/2016 | Saito | G03B 15/05 |
| 9,577,164 B2* | 2/2017 | Tsujimoto | H01L 33/22 |

(Continued)

FOREIGN PATENT DOCUMENTS

| AT | 414289 T | 11/2008 |
| AU | 4925601 A | 9/2001 |

(Continued)

OTHER PUBLICATIONS

International Search Report and Written Opinion of PCT Application No. PCT/JP2016/086619, dated Feb. 7, 2017, 09 pages of ISRWO.

*Primary Examiner* — Ida M Soward
(74) *Attorney, Agent, or Firm* — Chip Law Group

(57) ABSTRACT

A light-emission unit includes a light-emission section, a light extraction surface that extracts light outputted from the light-emission section, and a light-condensing section that is provided on side opposite the light extraction surface, with the light-emission section provided therebetween.

10 Claims, 14 Drawing Sheets

(56) References Cited

U.S. PATENT DOCUMENTS

| | | | |
|---|---|---|---|
| 9,716,083 B2* | 7/2017 | Makimura | H01L 31/02164 |
| 10,050,181 B2* | 8/2018 | Meng | H01L 33/44 |
| 2003/0016539 A1 | 1/2003 | Minano et al. | |
| 2005/0030960 A1* | 2/2005 | Sumida | G02B 6/0031 |
| | | | 370/402 |
| 2005/0168987 A1* | 8/2005 | Tamaoki | B43K 29/10 |
| | | | 362/244 |
| 2006/0119250 A1 | 6/2006 | Suehiro et al. | |
| 2010/0186798 A1* | 7/2010 | Tormen | H01L 31/0543 |
| | | | 136/246 |
| 2011/0090697 A1* | 4/2011 | Matsuzaki | G02B 5/0215 |
| | | | 362/293 |
| 2012/0018764 A1* | 1/2012 | Choi | H01L 33/20 |
| | | | 257/99 |
| 2012/0132946 A1* | 5/2012 | Park | H01L 33/44 |
| | | | 257/98 |
| 2013/0313965 A1* | 11/2013 | Chiang | H01L 33/58 |
| | | | 313/498 |
| 2015/0004276 A1* | 1/2015 | Kojima | G02B 5/045 |
| | | | 425/385 |
| 2015/0333237 A1* | 11/2015 | Facer | H01L 33/24 |
| | | | 257/40 |
| 2016/0093836 A1* | 3/2016 | Nakayama | H01L 51/0031 |
| | | | 438/46 |

FOREIGN PATENT DOCUMENTS

| | | |
|---|---|---|
| AU | 2002365761 A1 | 6/2003 |
| CA | 2402687 A1 | 9/2001 |
| CN | 1586017 A | 2/2005 |
| EP | 1266255 A2 | 12/2002 |
| EP | 1453107 A1 | 9/2004 |
| JP | 2004-087630 A | 3/2004 |
| JP | 2008-305802 A | 12/2008 |
| JP | 2009-027199 A | 2/2009 |
| JP | 2013-229145 A | 11/2013 |
| TW | 200305291 A | 10/2003 |
| WO | 2001/069300 A2 | 9/2001 |
| WO | 03/049207 A1 | 6/2003 |
| WO | 2007/005456 A2 | 1/2007 |

* cited by examiner

[ FIG. 1 ]
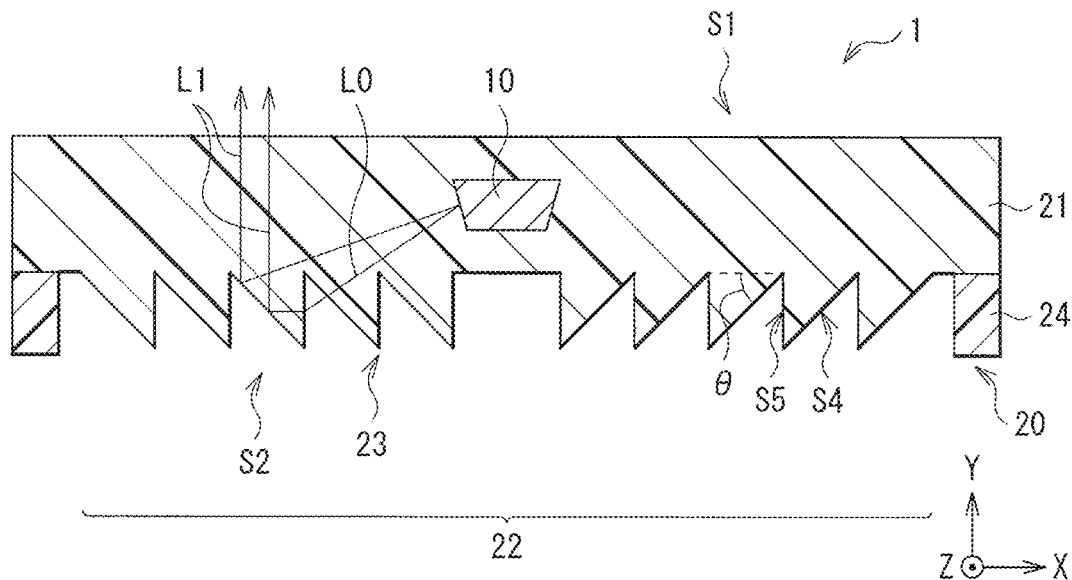
[ FIG. 2 ]
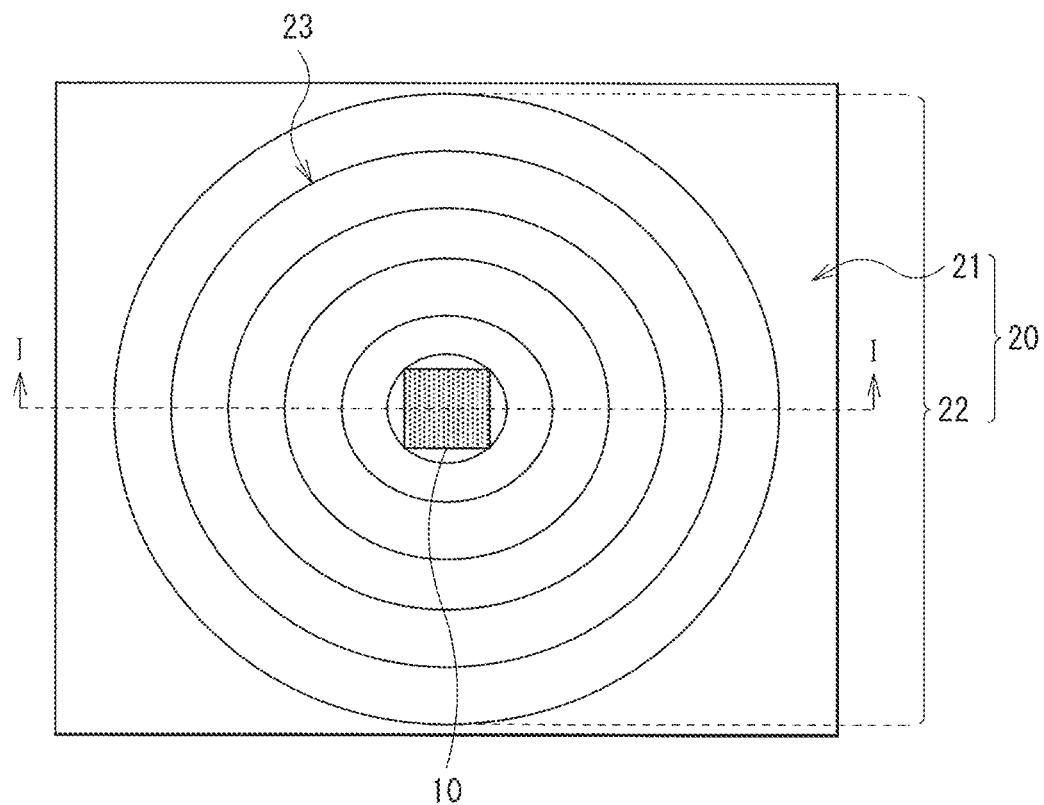

[ FIG. 3 ]
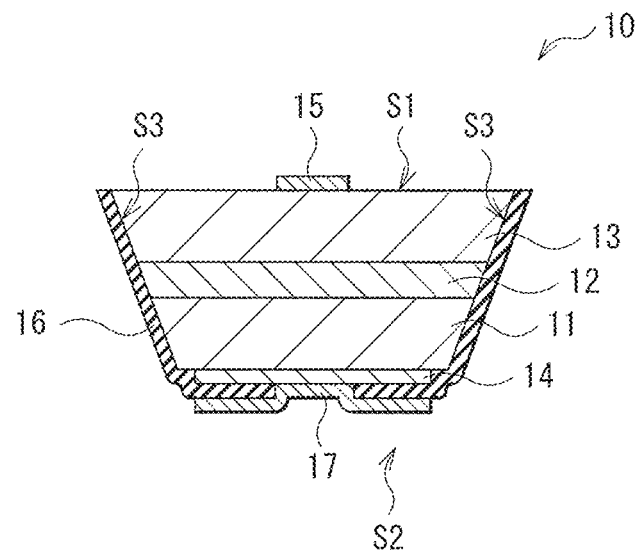
[ FIG. 4 ]
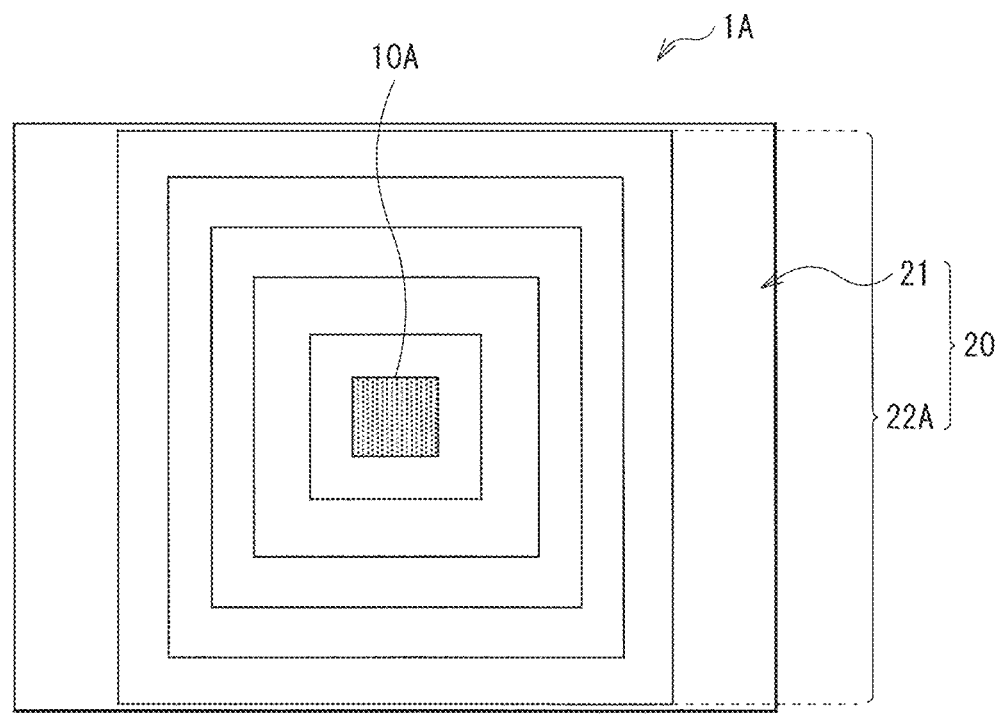

[FIG. 5]
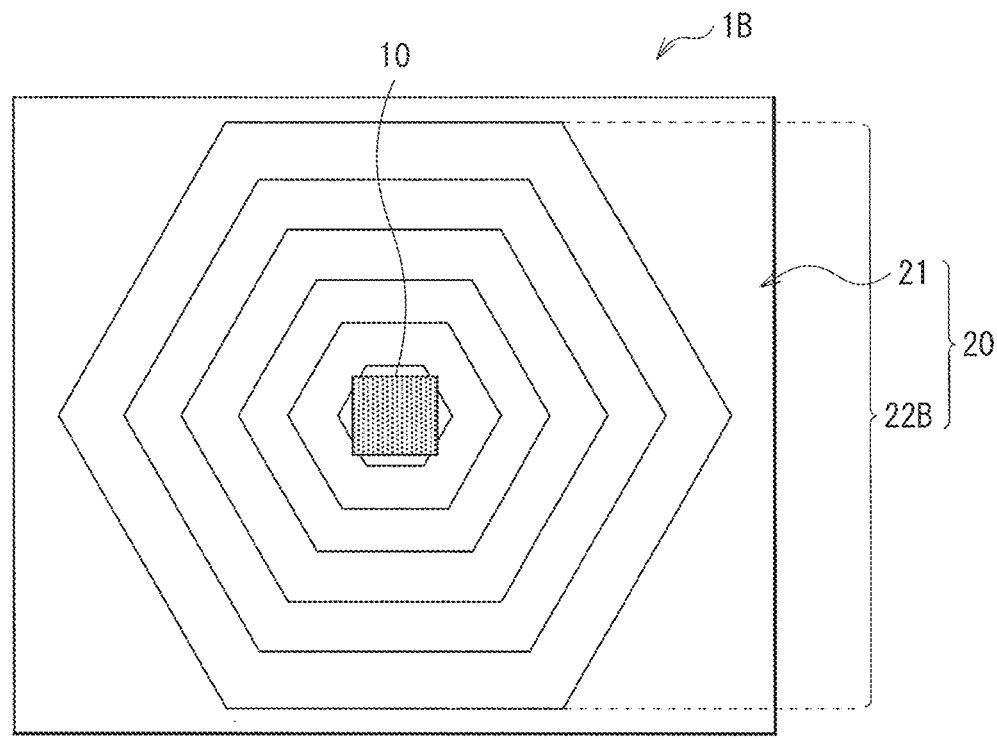
[FIG. 6]
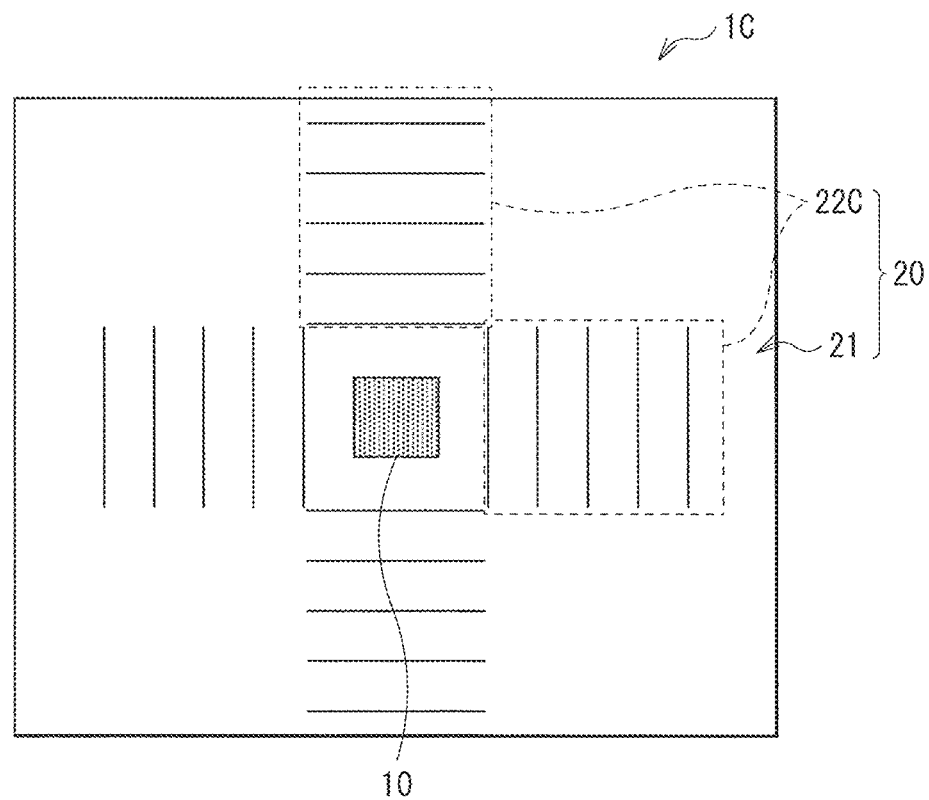

[ FIG. 7 ]
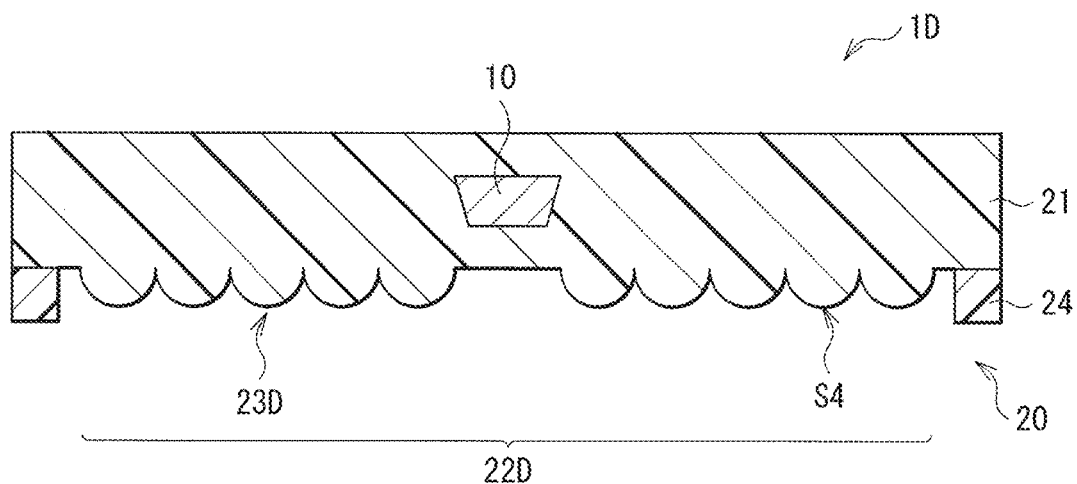
[ FIG. 8 ]
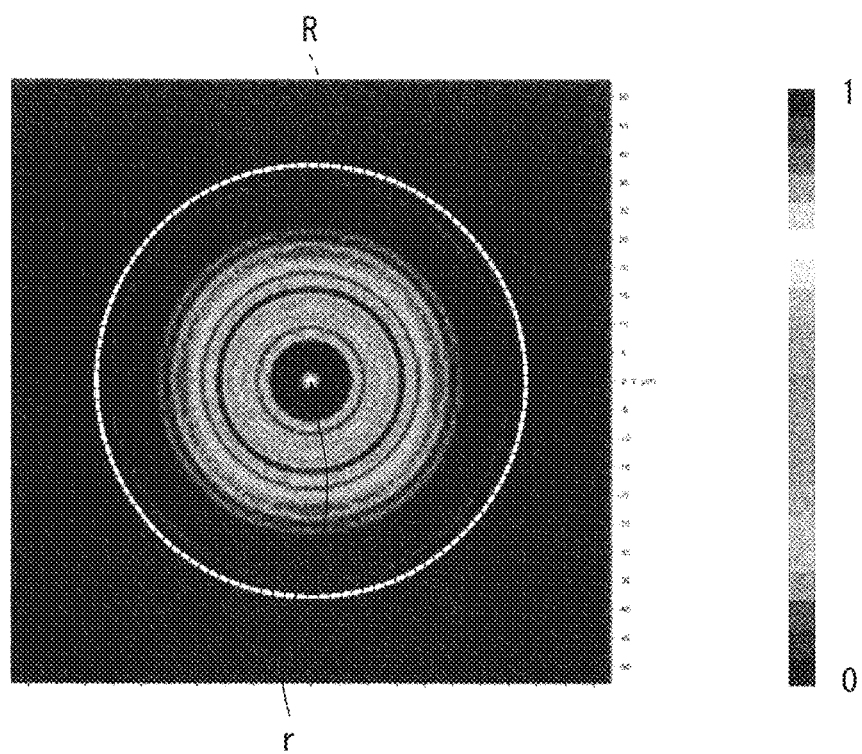

[ FIG. 9 ]
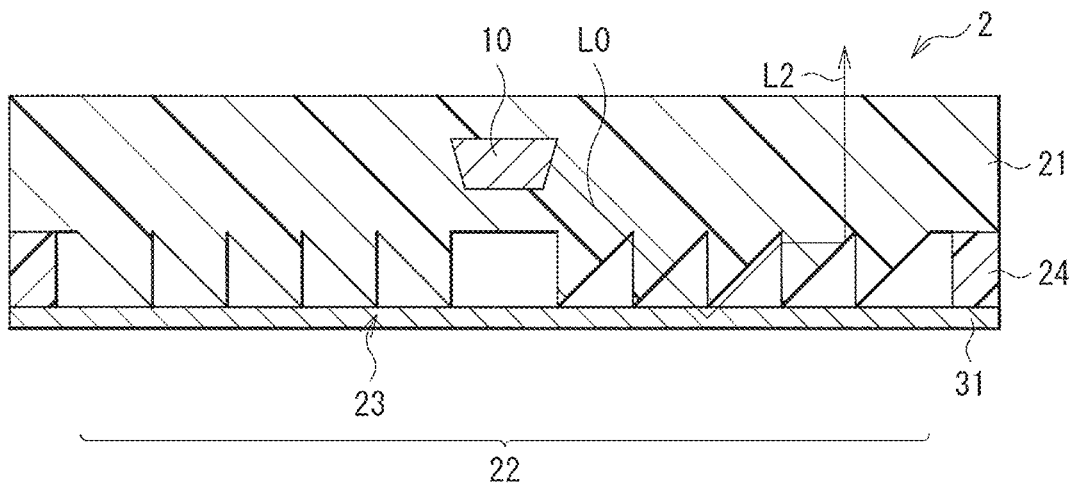
[ FIG. 10 ]
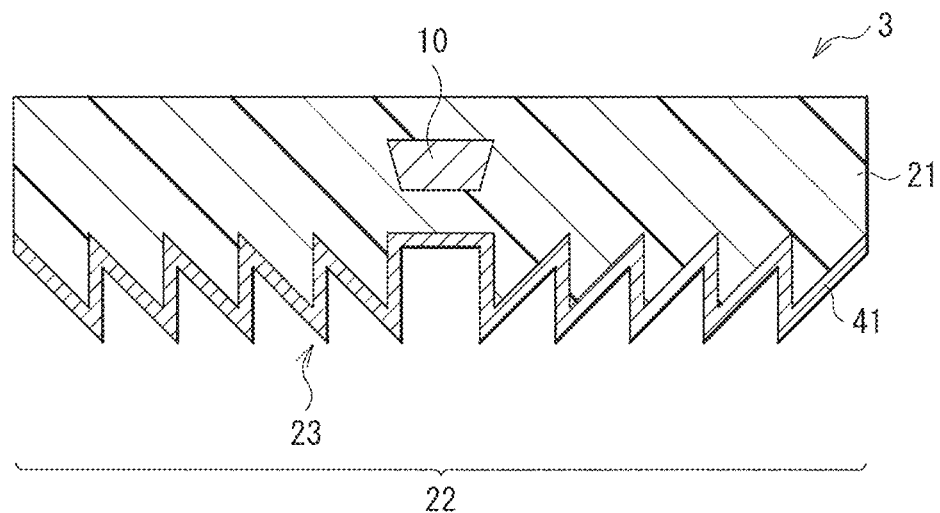
[ FIG. 11 ]
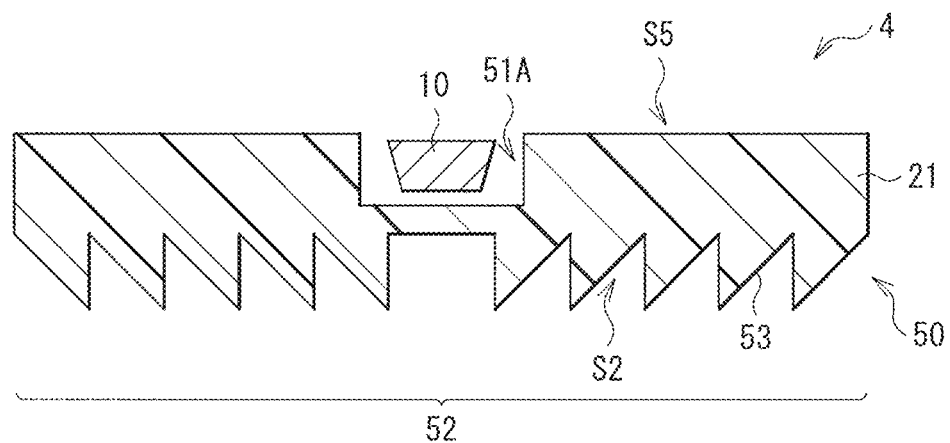

[ FIG. 12A ]
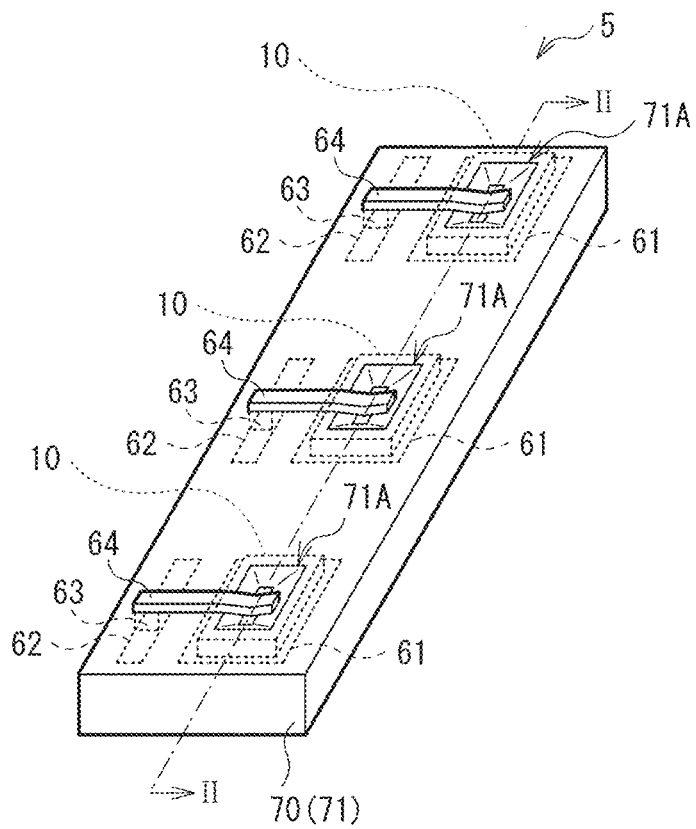
[ FIG. 12B ]
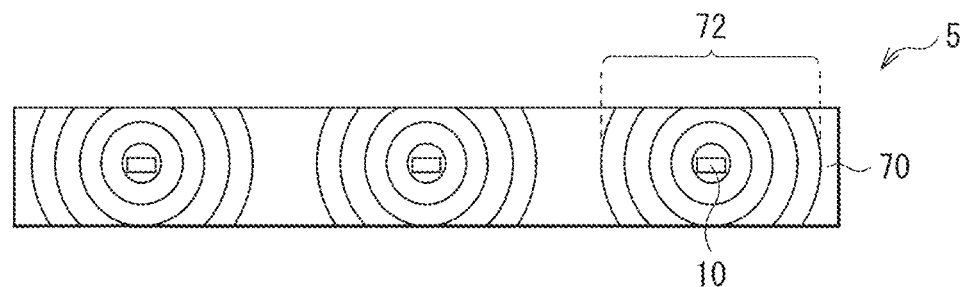
[ FIG. 12C ]
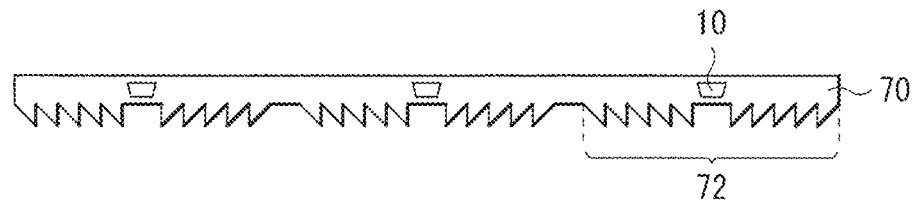

[ FIG. 13A ]
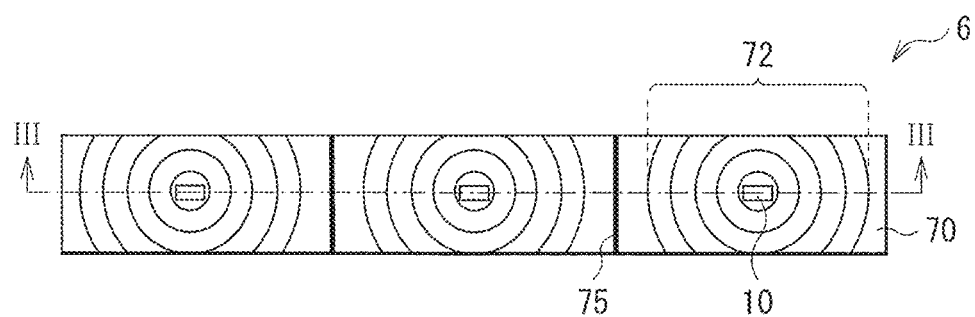
[ FIG. 13B ]
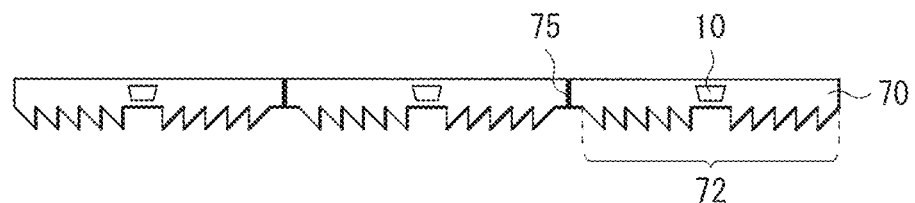

[FIG. 14]
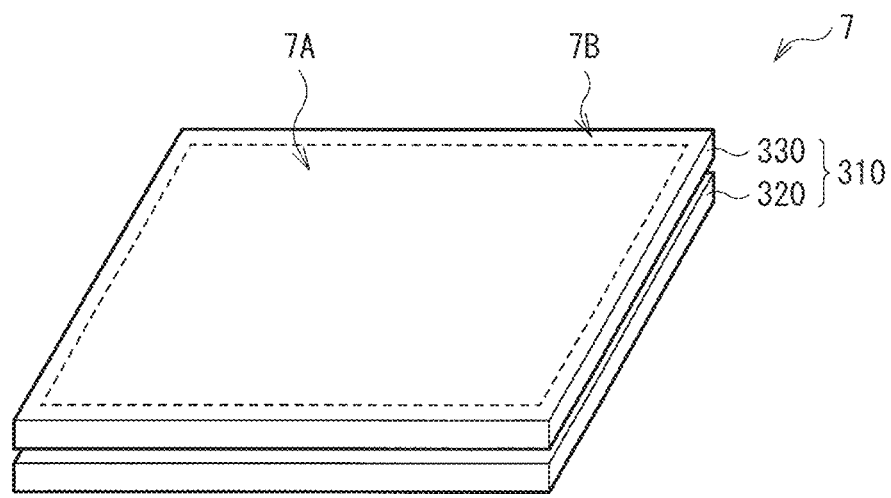
[FIG. 15]
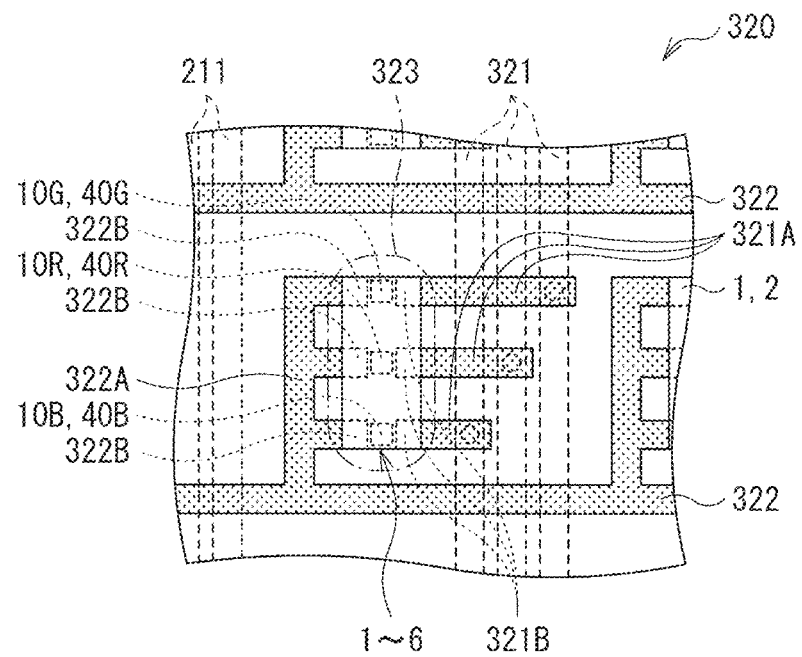

[ FIG. 16A ]
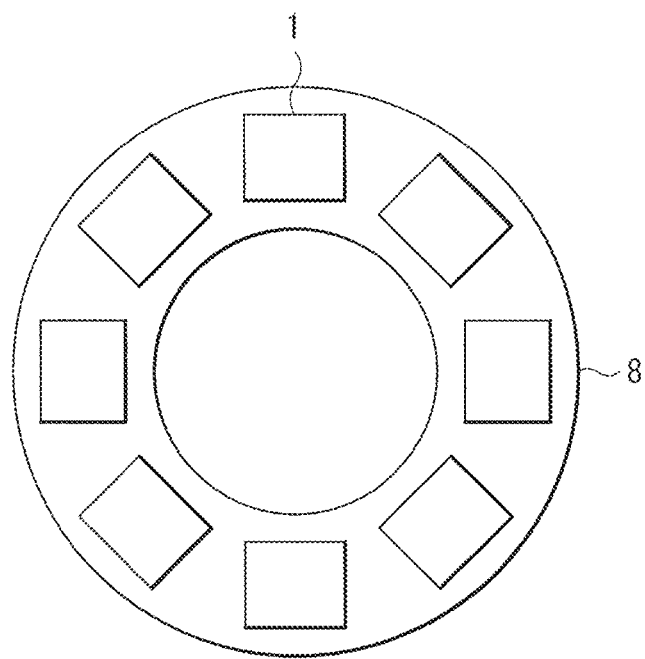
[ FIG. 16B ]
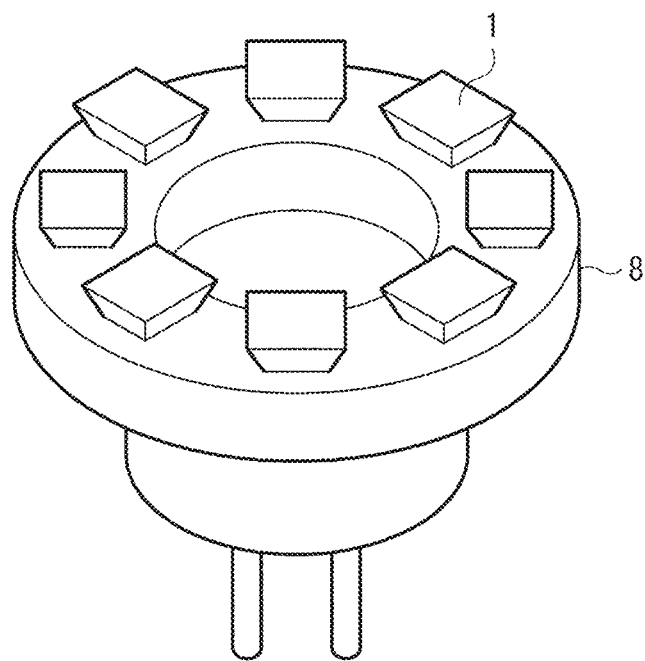

[ FIG. 17A ]
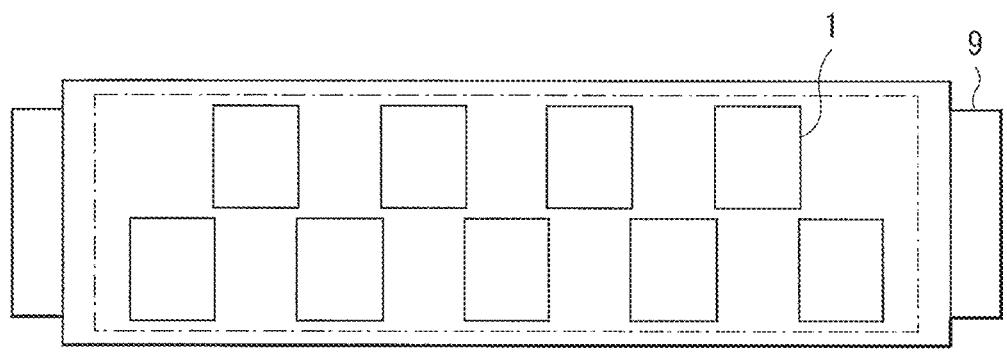
[ FIG. 17B ]
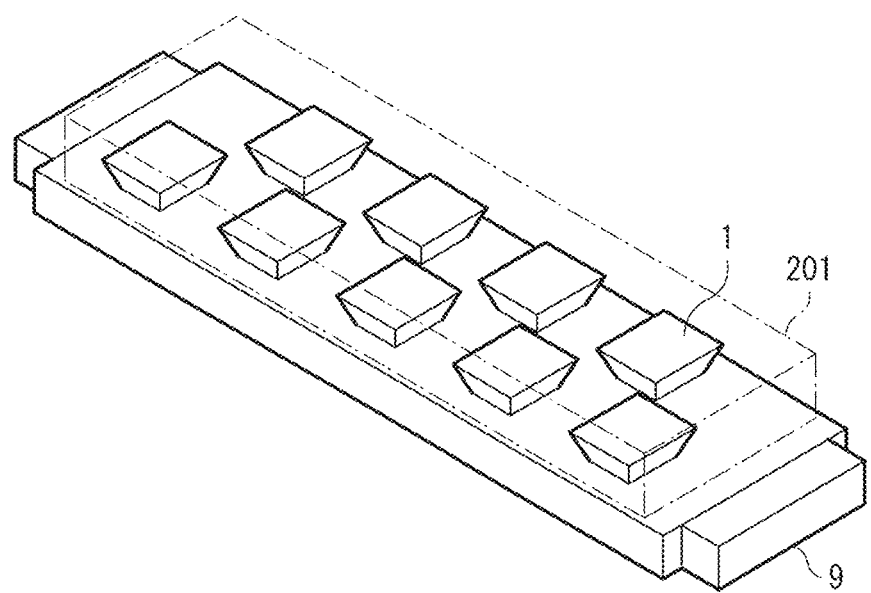

[ FIG. 18 ]
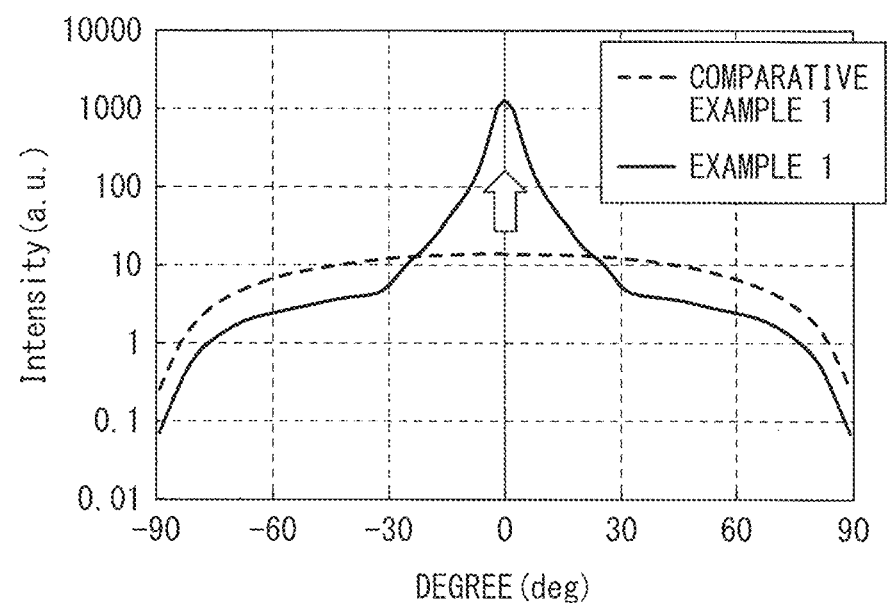
[ FIG. 19 ]
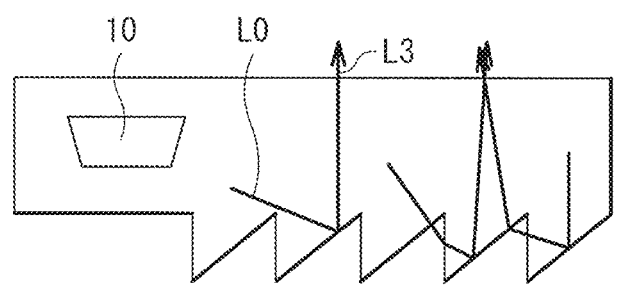

[ FIG. 20 ]
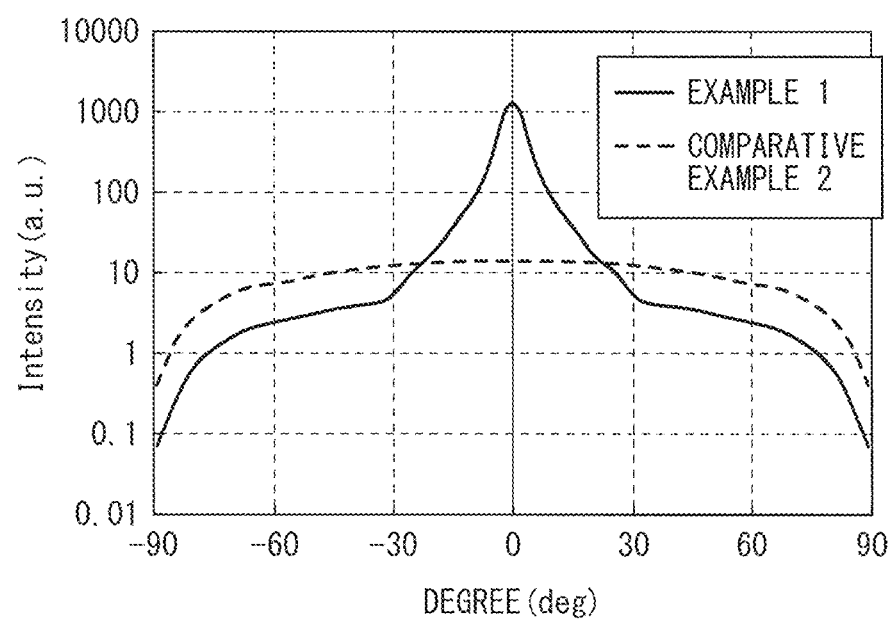
[ FIG. 21 ]
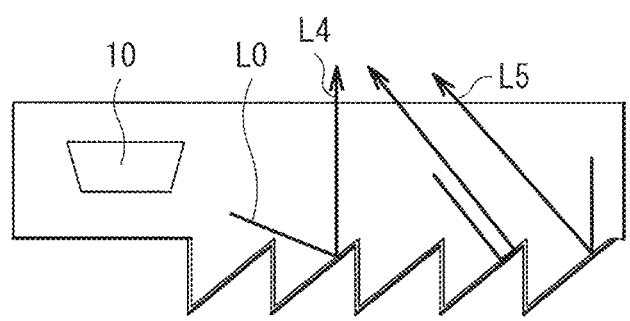

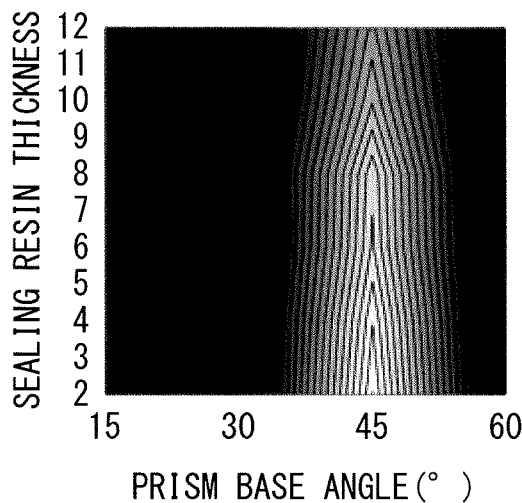
[ FIG. 22A ]
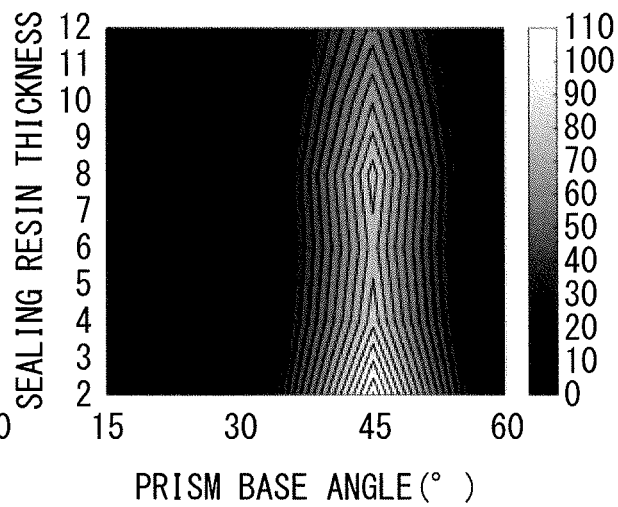
[ FIG. 22B ]
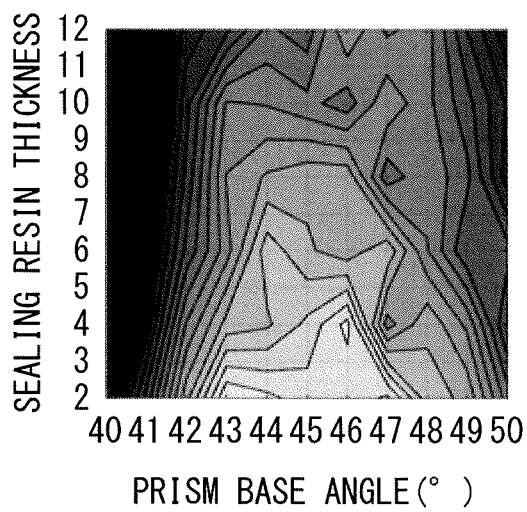
[ FIG. 23A ]
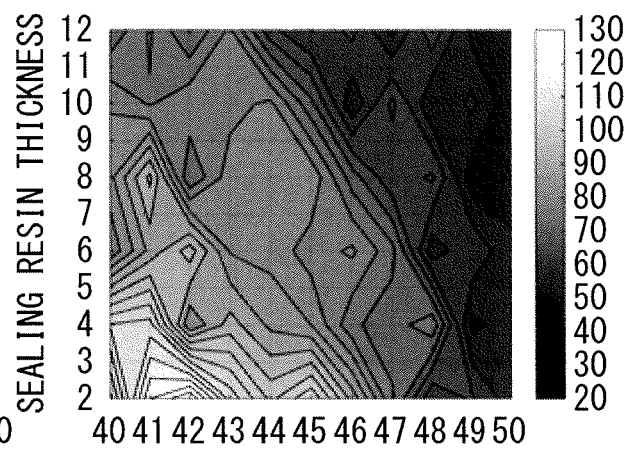
[ FIG. 23B ]

[ FIG. 24 ]
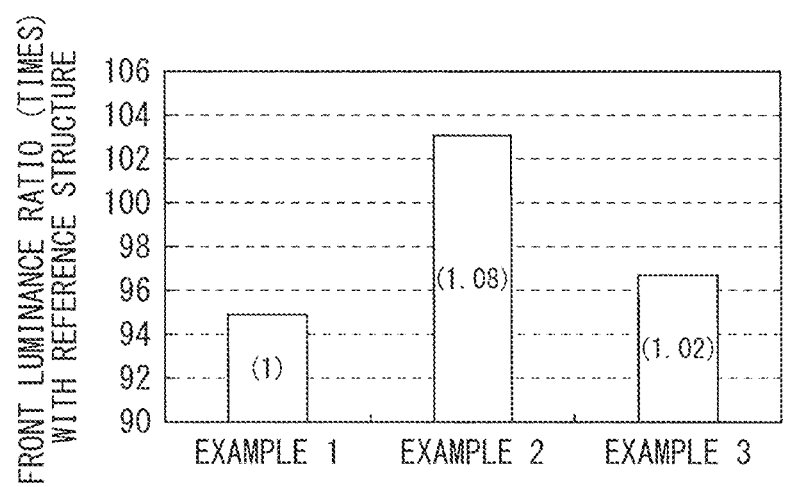
[ FIG. 25 ]
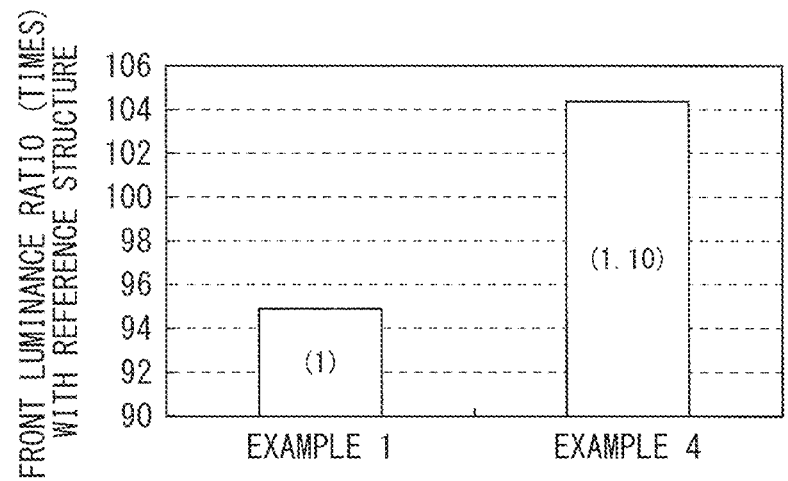

LIGHT-EMISSION UNIT AND DISPLAY

CROSS REFERENCE TO RELATED APPLICATIONS

This application is a U.S. National Phase of International Patent Application No. PCT/JP2016/086619 filed on Dec. 8, 2016, which claims priority benefit of Japanese Patent Application No. JP 2015-247658 filed in the Japan Patent Office on Dec. 18, 2015. Each of the above-referenced applications is hereby incorporated herein by reference in its entirety.

TECHNICAL FIELD

The disclosure relates to, for example, a light-emission unit including a light-emission element such as an LED, and a display including the light-emission unit.

BACKGROUND ART

In recent years, illumination units and displays each configured by assembling a plurality of light emitting diodes (LEDs) have become widespread. In particular, LED displays each using LEDs for display pixels have been receiving attention as a light-weight low-profile display, and have undergone various improvements such as enhancement of front luminance.

An ordinary LED is equipped with a reflector or lens, thereby increasing a bundle of outgoing beams in a frontward direction. However, to obtain a sufficient effect, it is necessary to enlarge the reflector or lens, thereby increasing height of back of a package (a light-emission unit including the LED). In particular, in a minute LED of micron order, in a case where a reflector or lens is enlarged, a size advantage is small, which is a large issue.

In regards to this, for example, PTL 1 and PTL 2 disclose an illumination unit in which a bundle of outgoing beams in a frontward direction is increased by disposing a Fresnel lens (PTL 1) or a microlens array (PTL 2) in a light extraction direction.

CITATION LIST

Patent Literature

PTL 1: Japanese Unexamined Patent Application Publication No. 2013-229145
PTL 2: Japanese Unexamined Patent Application Publication No. 2008-305802

SUMMARY OF INVENTION

However, as for the illumination unit described in PTL 1, although it is possible to decrease height of back of the lens, it is necessary to dispose an LED chip at a focus position of the lens, in order to obtain a sufficient bundle of outgoing beams in the frontward direction. For this reason, there is a limit to decreasing the height of the back of the package. Furthermore, as for the illumination unit (an LED lighting appliance) described in PTL 2, although it is possible to decrease the height of the back of the package, it has not been possible to sufficiently increase the bundle of outgoing beams in the frontward direction.

It is therefore desirable to provide a light-emission unit and a display that make it possible to enhance a bundle of outgoing beams in a frontward direction, for example, while suppressing an increase in height of back of a package.

A light-emission unit according to an embodiment of the disclosure includes: a light-emission section; a light extraction surface that extracts light emitted from the light-emission section; and a light-condensing section that is provided on side opposite the light extraction surface, with the light-emission section interposed therebetween.

A display according to an embodiment of the disclosure includes: a display panel that includes a plurality of light-emission units; and a drive circuit that drives each of the light-emission units on a basis of an image signal. In the display of the disclosure, each of the light-emission units includes components which are the same as components of the above-described light-emission unit.

In the light-emission unit and the display according to the respective embodiments of the disclosure, the light-condensing section is provided on the side opposite the light extraction surface, with the light-emission section interposed therebetween. It is therefore possible to reflect the light emitted in a direction other than a light extraction direction toward the light extraction direction.

According to the light-emission unit and the display in the respective embodiments of the disclosure, light emitted in a direction other than the light extraction direction is reflected toward the light extraction direction by providing the light-condensing section on the side opposite the light extraction surface, with the light-emission section interposed therebetween. It is therefore possible to enhance, for example, a bundle of outgoing beams in a frontward direction, while suppressing an increase in height of a back. It is to be noted that effects described here are not necessarily limitative, and may be any of effects described in the disclosure.

BRIEF DESCRIPTION OF DRAWINGS

FIG. 1 is a cross-sectional view of a configuration example of a light-emission unit according to a first embodiment of the disclosure.

FIG. 2 is a plan view of a configuration example of the light-emission unit illustrated in FIG. 1.

FIG. 3 is a cross-sectional view of a configuration of a light-emission element mounted in the light-emission unit illustrated in FIG. 1.

FIG. 4 is a plan view of another configuration example of the light-emission unit illustrated in FIG. 1.

FIG. 5 is a plan view of another configuration example of the light-emission unit illustrated in FIG. 1.

FIG. 6 is a plan view of another configuration example of the light-emission unit illustrated in FIG. 1.

FIG. 7 is a cross-sectional view of another configuration example of the light-emission unit illustrated in FIG. 1.

FIG. 8 is a simulation diagram of a light emission region in the light-emission unit illustrated in FIG. 1.

FIG. 9 is a cross-sectional view of a configuration of a light-emission unit according to a second embodiment of the disclosure.

FIG. 10 is a cross-sectional view of a configuration of a light-emission unit according to a third embodiment of the disclosure.

FIG. 11 is a cross-sectional view of a configuration of a light-emission unit according to a fourth embodiment of the disclosure.

FIG. 12A is a perspective view of a configuration of a light-emission unit according to a modification example 1 of the disclosure.

FIG. 12B is a plan view of a configuration of the light-emission unit illustrated in FIG. 12A.

FIG. 12C is a cross-sectional view of a configuration of the light-emission unit illustrated in FIG. 12A.

FIG. 13A is a plan view of a configuration of a light-emission unit according to a modification example 2 of the disclosure.

FIG. 13B is a cross-sectional view of a configuration of the light-emission unit illustrated in FIG. 13A.

FIG. 14 is a perspective view of a configuration example of a display serving as an application example 1.

FIG. 15 is a schematic diagram illustrating an example of a wiring layout of the display illustrated in FIG. 14.

FIG. 16A is a plan view of a configuration example of an illumination unit serving as an application example 2.

FIG. 16B is a perspective view of a configuration of the illumination unit illustrated in FIG. 16A.

FIG. 17A is a plan view of a configuration example of an illumination unit serving as an application example 3.

FIG. 17B is a perspective view of a configuration of the illumination unit illustrated in FIG. 17A.

FIG. 18 illustrates light distribution properties of an example 1 and a comparative example 1 in verification 1.

FIG. 19 is a cross-sectional schematic diagram illustrating working in the example 1.

FIG. 20 illustrates light distribution properties of the example 1 and a comparative example 2 in verification 2.

FIG. 21 is a cross-sectional schematic diagram illustrating working in the comparative example 2.

FIGS. 22A and 22B is a are characteristic diagrams illustrating front luminance depending on a prism base angle and a thickness of a sealing resin in each refractive index material.

FIGS. 23A and 23B are characteristic diagrams illustrating an enlarged portion corresponding to prism base angles of 40 degrees to 50 degrees of the characteristic diagram illustrated in FIGS. 22A and 22B.

FIG. 24 is a characteristic diagram illustrating a front luminance ratio in the example 1 and an example 4 as well as a comparative example 3 in verification 4.

FIG. 25 is a characteristic diagram illustrating a front luminance ratio in the example 1 and an example 5 in verification 5.

MODES FOR CARRYING OUT THE INVENTION

Some embodiments of the disclosure are described below in detail with reference to the drawings. It is to be noted that the description is given in the following order.

1. First Embodiment (an example in which a light-condensing section is disposed on a back face of a light-emission element)
  1-1. Configuration of Light-Emission Unit
  1-2. Working and Effect
2. Second Embodiment (an example in which a reflection member is disposed on a back face of a light-condensing section)
3. Third Embodiment (an example in which an antireflection film is formed at a light-condensing section)
4. Fourth Embodiment (an example in which a light-emission element is placed on a supporting member)
5. Modification Example 1 (an example in which a light-emission unit includes a plurality of light-emission elements)
6. Modification Example 2 (an example in which a light-shielding section is provided between light-emission elements)
7. Application Examples
8. Examples 1. First Embodiment FIG. 1 illustrates a cross-sectional configuration of a light-emission unit (a light-emission unit 1) according to a first embodiment of the disclosure, and FIG. 2 illustrates a plane configuration of the light-emission unit 1 illustrated in FIG. 1. It is to be noted that FIG. 1 illustrates a cross section taken along I-I and seen from an arrow direction of the light-emission unit 1 illustrated in FIG. 2. The light-emission unit 1 is, for example, suitably applicable as a display pixel of a display, which is a so-called LED display, or as an illumination unit. The light-emission unit 1 is a micro package in which a light-emission element (a light-emission element 10) is covered with a thin resin (e.g., a holding section 20). The light-emission unit 1 of the present embodiment includes a light-condensing section 22 on a surface S2 opposite a light extraction surface S1 of the holding section 20 that holds the light-emission element 10 (a light-emission section).

(1-1. Configuration of Light-Emission Unit)

The light-emission unit 1 includes the light-emission element 10 and the holding section 20 that holds the light-emission element 10. The light-emission element 10 is a solid-state light-emission element that emits light of a predetermined wavelength band from a top surface, and specifically, an LED chip. The holding section 20 includes a sealing section 21 that seals the light-emission element 10, and the light-condensing section 22 provided on the surface S2 opposite the light extraction surface S1 of the sealing section 21. The light-condensing section 22 includes a plurality of projections 23 projecting on the surface S2 side.

The light-emission element 10 is, for example, the LED chip as described above. Here, the LED chip refers to an element in a state of being cut out from a wafer used for crystal growth, and does not refer to a package type element covered with, for example, a molded resin. The LED chip has a size of, for example, 5 µm or more and 100 mm or less, and is a so-called micro LED. The LED chip has, for example, a substantially square planar shape. The LED chip is shaped like a flake, and has an aspect ratio (height/width) of, for example, 0.1 or more and less than 1.

The light-emission element 10 is disposed within the light-emission unit 1, and is sealed by the sealing section 21 as illustrated in FIG. 1, for example. The light-emission element 10 includes, for example, a semiconductor layer in which a first conductive type layer 11, an active layer 12, and a second conductive type layer 13 are stacked in order, as illustrated in FIG. 3. The first conductive type layer 11, the active layer 12, and the second conductive type layer 13 include, for example, a AlGaInP-based semiconductor material and a InGaN-based semiconductor material. In the light-emission element 10, red light is obtained through the use of the AlGaInP-based semiconductor material, and blue light is obtained through the use of the InGaN-based semiconductor material.

A second electrode 15 is provided on a top surface (the light extraction surface S1 side) of the second conductive type layer 13. The second electrode 15 includes, for example, a laminated film of materials such as titanium (Ti)/platinum (Pt)/gold (Au), or a gold-germanium alloy (AuGe)/nickel (Ni)/Au. The second electrode 15 is in contact with the second conductive type layer 13 and is electrically coupled to the second conductive type layer 13. In other words, the second electrode 15 is in ohmic contact with the second conductive type layer 13. A first electrode 14 is provided on an undersurface (the surface S2 side) of the first conductive type layer 11. The first electrode 14 is a metal electrode, and includes, for example, a laminated film of materials such as Ti/Pt/Au, or AuGe/Ni/Au. The first electrode 14 is in contact with the first conductive type layer 11, and is electrically coupled to the first conductive type layer 11. In other words, the first electrode 14 is in ohmic contact with the first conductive type layer 11. The first electrode 14 and the second electrode 15 may each be configured using a single electrode, or may be configured using a plurality of electrodes. It is to be noted that the first electrode 14 and the second electrode 15 may include, for example, a metallic material having high reflectivity such as silver (Ag) and aluminum (Al).

A side surface S3 of the light-emission element 10 (specifically, the semiconductor layer) is, for example, a sloping surface intersecting a lamination direction, as illustrated in FIG. 3. Specifically, the side surface S3 is such a sloping surface that a cross section of the light-emission element 10 has a reverse trapezoidal shape. In this way, because the side surface S3 has a tapered shape, it is possible to increase efficiency of light extraction in a frontward direction. It is to be noted that the side surface S3 may be, for example, a vertical surface orthogonal to the lamination direction. The light-emission element 10 is covered with an insulating layer 16, from the side surface S3 of the semiconductor layer to the undersurface (the surface S2). The insulating layer 16 is a thin layer, and formed by, for example, a film formation process such as CVD, vapor deposition, and sputtering. The insulating layer 16 is formed of, for example, a material transparent with respect to light emitted from the active layer 12, such as $SiO_2$, SiN, $Al_2O_3$, $TiO_2$, and TiN. The insulating layer 16 has a thickness of, for example, about 0.1 µm to 1 µm, and this thickness is substantially uniform.

A pad electrode 17 is an electrode extracted from the first electrode 14 (i.e., an extraction electrode). The pad electrode 17 is formed over a surface of the insulating layer 16 from an exposed surface 14A of the first electrode 14. The pad electrode 17 is electrically coupled to the first electrode 14. The pad electrode 17 is formed of a material that reflects light emitted from the active layer 12 with a high reflectance, e.g., Ti, Al, Cu, Au, Ni, or an alloy of these materials. Further, the pad electrode 17 may be formed as a multilayer film made of a plurality of materials among the above-described materials.

It is to be noted that the light-emission element 10 may be configured in such a manner that the insulating layer 16 and the pad electrode 17 are omitted and the first electrode 14 is exposed, in some cases.

The holding section 20 includes the sealing section 21 that seals the light-emission element 10, and the light-condensing section 22 that includes the plurality of projections 23 and a support section 24 that supports the light-emission unit 1 which are provided on the surface S2 opposite the light extraction surface S1 of the sealing section 21.

The sealing section 21 is, for example, a section that surrounds and holds the entire light-emission element 10. The sealing section 21 includes, for example, a resin material such as silicone, acrylic, epoxy, and polycarbonate. The sealing section 21 may partially include another material such as polyimide. The sealing section 21 has a height higher than the height of the light-emission element 10, and has a breadth wider than the width of the light-emission element 10. The sealing section 21 in itself has a size of, for example, 1 mm or less. The sealing section 21 is shaped like a flake. The sealing section 21 has an aspect ratio (maximum height/maximum breadth) that is small to the extent that the light-emission unit 1 is not set to be in a landscape orientation when the light-emission unit 1 is transferred, and this aspect ratio is, for example, ⅕ or less.

The light-condensing section 22 is arranged on the surface S2 side opposite the light extraction surface S1 formed by the sealing section 21, and is provided to reflect light (light L0) outputted from the light-emission element 10 in a direction toward the surface S2, in such a manner that the reflected light (light L1) travels in a direction toward the light extraction surface S1. A material of the light-condensing section 22 is, preferably, a transparent material having a small refractive index, and examples of this material include resin materials such as silicone, acrylic, epoxy, and polycarbonate.

The light-condensing section 22 includes the plurality of projections 23 projecting on the surface S2 side, and the projections 23 each have at least a surface facing the light-emission element 10. Specifically, for example, as illustrated in FIG. 1, the projections 23 preferably each have a shape (a prism shape) formed by a sloping surface (a surface S4) facing the light-emission element 10 and a steep surface (a surface S5) rising in a Y-axis direction. The sloping surface (the surface S4) preferably has an inclination (an angle θ) of, for example, 40 degrees or more and 50 degrees or less. It is preferable to provide, for example, a so-called prism array in which the above-described plurality of projections 23 are concentrically provided around the light-emission element 10, as illustrated in FIG. 2. This makes it possible to efficiently reflect the light L0 outputted from the active layer 12 of the light-emission element 10 in the direction toward the surface S2 (a depression angle direction), in such a manner that the reflected light (the light L1) travels in the direction toward the surface S1, as represented by the light L1 illustrated in FIG. 1.

It is to be noted that the projection 23 is not necessarily arranged concentrically. For example, a rectangular shape as in a light-emission unit 1A illustrated in FIG. 4 or a hexagon shape as in a light-emission unit 1B illustrated in FIG. 5 may be formed. In addition, a projection 22A is not necessarily formed around the light-emission element 10 continuously, and may be provided in a partial region of the periphery of the light-emission element 10. For example, as represented by a light-condensing section 22C of a light-emission unit 1C illustrated in FIG. 6, the projections 23 may be provided in four directions around the light-emission element 10.

In addition, the projection 23 is not necessarily in the prism shape, and if at least a surface facing the light-emission element 10 is provided, the surface is not necessarily planar. For example, the surface facing the light-emission element 10 may be a curved surface, although an effect is inferior to that of the light-emission unit 1 illustrated in FIG. 1. For example, as in a light-emission unit 1D illustrated in FIG. 7, a light-condensing section 22D formed of projections 23D each having a lens shape may be provided.

FIG. 8 illustrates a result obtained by simulating a light emission distribution of the light-emission unit 1 illustrated in FIG. 1 and FIG. 2. As illustrated in FIG. 8, the light-emission unit 1 has a light emission region including a light emission region r of the light-emission element 10 and a formation region (a prism formation region R) of the light-condensing section 22 provided therearound. It is therefore possible to achieve a desirable light emission region by appropriately arranging the light-condensing section 22.

The light-condensing section 22 may be formed integrally with the sealing section 21, or may be adhered to the surface S2 side of the sealing section 21 after being formed separately from the sealing section 21. It is possible to form the light-condensing section 22 of the present embodiment by, for example, using photolithography.

The support section 24 is, for example, provided to place the light-emission unit 1 stably when being mounted on a mounting substrate of an illumination unit 8 (for example, see FIG. 16) described later. The support section 24 may be formed, for example, using the same material as the above-described materials of the sealing section 21 and the light-condensing section 22, or may be formed using a resin material of a high insulation property.

1-2. Working and Effect

Next, working and effect of the light-emission unit 1 of the present embodiment are described.

As described above, to increase a bundle of outgoing beams in a frontward direction, a reflector or lens is used in a light-emission element such as an LED that outputs light omnidirectionally. However, it is necessary to use a large reflector or lens to obtain a sufficient effect, and this increases height of back of a package.

In regards to this, in recent years, there has been developed an illumination unit that has increased a bundle of outgoing beams in a frontward direction while suppressing an increase in height of a back by disposing a Fresnel lens or a microlens array in a light extraction direction with respect to an LED. However, as for an illumination unit using a Fresnel lens, although it is possible to increase a bundle of outgoing beams by reflecting light outputted in an oblique direction toward a light extraction direction (a frontward direction), it is necessary to dispose an LED at a focus position of the lens, in order to obtain a sufficient effect. For this reason, there is a limit to decreasing height of back of a package. Further, in a case where a microlens array is used, although it is possible to reduce a distance between an LED and the microlens array, an effect of increasing a bundle of outgoing beams in a frontward direction is insufficient.

In contrast, in the light-emission unit 1 of the present embodiment, the light-condensing section 22 is formed on the surface S2 opposite the light extraction surface S1 of the holding section 20 holding the light-emission element 10, namely, on a back face of the light-emission element 10. This light-condensing section 22 includes the plurality of projections 23 each projecting in a direction opposite to the light extraction surface 51, and this projection 23 includes the sloping surface desiring the light-emission element 10. For this reason, light outputted from the light-emission element 10 in a direction (a depression angle direction with reference to an in-plane direction of the active layer 12) other than the light extraction direction (an elevation angle direction with reference to an in-plane direction of the active layer 12) is reflected by the sloping surface S4 toward the light extraction direction. At this moment, the light outputted in the depression angle direction rises substantially in the frontward direction owing to the sloping surface S4, without depending on the incident angle thereof. It is therefore possible to enhance the bundle of outgoing beams in the frontward direction, without depending on a distance between the light-emission element 10 and the light-condensing section 22. In other words, in the light-emission unit 1 of the present embodiment, it is possible to enhance the bundle of outgoing beams in the frontward direction while suppressing an increase in height of back of the light-emission unit 1.

In addition, in the light-emission unit 1 of the present embodiment, precise alignment between the light-emission element 10 and the projections 23 included in the light-condensing section 22 is unnecessary and thus, low-cost and easy fabrication is possible as compared with an ordinary illumination unit in which a component such as a Fresnel lens is disposed in a frontward direction.

Next, second to fourth embodiments as well as modification examples 1 and 2 are described. It is to be noted that components corresponding to those in the light-emission unit 1 of the above-described first embodiment are denoted by the same reference numerals, and the description thereof is provided.

2. Second Embodiment

FIG. 9 illustrates a cross-sectional configuration of a light-emission unit (a light-emission unit 2) according to the second embodiment of the disclosure. The light-emission unit 2 is, for example, suitably applicable as a display pixel of a display, which is a so-called LED display, as with the above-described first embodiment. The light-emission unit 2 of the present embodiment has such a configuration that a reflection member 31 is disposed on a back face (the surface S2) side of the holding section 20 holding the light-emission element 10.

The reflection member 31 is provided to reflect light passing through without being reflected at the sloping surface S4 of the projection 23 included in the light-condensing section 22 toward the frontward direction. Preferably, the reflection member 31 is a member making it possible to reflect light, and is, for example, a plate-like member. In particular, preferably, the reflection member 31 is a member subjected to mirror-like finishing to have a surface coated with, for example, aluminum (Al), silver (Ag), or a multilayer film of these materials. The reflection member 31 is disposed on the back face of the holding section 20 with an air layer interposed therebetween. It is to be noted that, for example, a resin may be provided to fill a space between the reflection member 31 and the holding section 20. In that case, it is preferable to use a material having a refractive index smaller than that of a resin that forms the light-condensing section 22.

In the light-emission unit 1 of the above-described first embodiment, the light (the light L0) entering at an angle smaller than a critical angle with respect to the sloping surface S4 of the projection 23 included in the light-condensing section 22 passes through the sloping surface S4, resulting in a loss component. In contrast, in the present embodiment, the reflection member 31 is disposed on the back face of the holding section 20. This makes it possible to reflect at least a partial component (light L2) of the light (the light L0) passing through the sloping surface S4 toward the frontward direction, as illustrated in FIG. 9. It is therefore possible to further increase front luminance than the above-described first embodiment.

3. Third Embodiment

FIG. 10 illustrates a cross-sectional configuration of a light-emission unit (a light-emission unit 3) according to the third embodiment of the disclosure. The light-emission unit 3 is, for example, suitably applicable as a display pixel of a display, which is a so-called LED display, as with the above-described first and second embodiments. The light-emission unit 3 of the present embodiment has such a configuration that an antireflection film 41 is provided on a surface of the light-condensing section 22 provided on the back face (the surface S2) side of the holding section 20 holding the light-emission element 10. It is to be noted that, here, the support section 24 illustrated on a peripheral edge of the holding section 20 in figures including FIG. 1 is omitted.

Examples of a material of the antireflection film 41 include a low refractive index material such as magnesium fluoride ($MgF_2$). In addition, the antireflection film 41 may be formed, for example, as a laminated film in which two or more layers of a low refractive index material and a high refractive index material such as $SiO_2$ and $TiO_2$ are stacked. The antireflection film 41 may have a film thickness of wavelength order. It is possible to form the antireflection film 41 by using, for example, a wet method such as spin coating and spraying, or a dry method such vacuum vapor deposition.

In the light-emission unit 1 of the above-described first embodiment, a portion of light becomes a loss component without being reflected in the frontward direction due to Fresnel reflection, when refracted at the sloping surface S4 of the projection 23 included in the light-condensing section 22. In contrast, in the present embodiment, the antireflection film 41 is formed on the surface of the light-condensing section 22. This makes it possible to reduce the Fresnel reflection at the sloping surface S4. It is therefore possible to increase the front luminance further than the above-described first embodiment.

4. Fourth Embodiment

FIG. 11 illustrates a cross-sectional configuration of a light-emission unit (a light-emission unit 4) according to the fourth embodiment of the disclosure. The light-emission unit 4 is, for example, suitably applicable as a display pixel of a display, which is a so-called LED display, as with the above-described first to third embodiments. The light-emission unit 4 of the present embodiment is a unit in which the light-emission element 10 is attached to a holding section 50 including a light-condensing section 52 formed of a plurality of projections 53. It is to be noted that, in FIG. 11, there is a space between the holding section 50 and the light-emission element 10, but the light-emission element 10 may be directly placed on the holding section 50 or may be placed with another member interposed therebetween. It is to be noted that, here, the support section 24 illustrated on the peripheral edge of the holding section 20 in figures including FIG. 1 is omitted.

The holding section 50 includes a sealing section 51 and the light-condensing section 52 provided on the surface S2 side of the sealing section 51, and an opening 51A for accommodation of the light-emission element 10 is provided on a surface S5 opposite the surface S2 of the sealing section 51. In other words, the light-emission element 10 has a configuration of being placed within the opening 51A provided in the sealing section 51.

As in the light-emission unit 4 of the present embodiment, even in a case where the light-emission element 10 is attached to the holding section 50, it is possible to enhance the bundle of outgoing beams in the frontward direction as in the above-described first embodiment by arranging the light-condensing section 52 on the back face of the light-emission element 10, namely, a surface opposite a light extraction surface of the light-emission unit 4.

5. Modification Example 1

FIG. 12A perspectively illustrates an example of a schematic configuration of a light-emission unit (a light-emission unit 5) according to the modification example 1 of the disclosure. FIG. 12B illustrates a plane configuration of the light-emission unit 5 illustrated in FIG. 12A, and FIG. 12C illustrates an example of a cross-sectional configuration taken along II-II and seen from an arrow direction of the light-emission unit 5 illustrated in FIG. 12A. The light-emission unit 5 is, for example, suitably applicable as a display pixel of a display, which is a so-called LED display, or as a printer head. The light-emission unit 5 of the present modification example is a micro package in which a plurality of light-emission elements 10 are disposed within a sealing section 71. It is to be noted that, here, the support section 24 illustrated on the peripheral edge of the holding section 20 in figures including FIG. 1 is omitted.

The light-emission unit 5 includes, for example, three light-emission elements 10 as illustrated in figures including FIG. 12A. Each of the light-emission elements 10 is a solid-state light-emission element that emits light of a predetermined wavelength band from a top surface, and is, specifically, an LED chip. Each of the light-emission elements 10 has a configuration similar to that in the above-described first embodiment. The light-emission elements 10 are disposed within the sealing section 71, and for example, arranged in a line with a predetermined clearance formed between the light-emission elements 10, as illustrated in FIG. 12A. At this time, in a holding section 70 of the light-emission unit 5, a light-condensing section 72 is formed around each of the light-emission elements 10, as illustrated in FIGS. 12B and 12C. In addition, the light-emission unit 1 has, for example, an elongate shape extending in an array direction of the light-emission elements 10. The clearance between the two light-emission elements 10 adjacent to each other is, for example, equal to or greater than the size of each of the light-emission elements 10. It is to be noted that the above-described clearance may be narrower than the size of each of the light-emission elements 10 in some cases.

The light-emission unit 5 includes the holding section 70 shaped like a chip and covering each of the light-emission elements 10, and terminal electrodes 61 and 62 electrically coupled to each of the light-emission elements 10, as illustrated in FIG. 12A. The terminal electrodes 61 and 62 are disposed on an undersurface side of the sealing section 71.

The sealing section 71 surrounds and holds each of the light-emission elements 10 at least from the side surface side of each of the light-emission elements 10. The sealing section 71 includes, for example, a resin material such as silicone, acrylic, epoxy, and polycarbonate, as with the above-described sealing section 21. The sealing section 71 may partially include another material such as polyimide. The sealing section 71 is formed in contact with the side surface of each of the light-emission elements 10, and a region, in which the second electrode 15 is not formed, of the top surface of each of the light-emission elements 10. The sealing section 71 has an elongate shape (for example, a rectangular solid shape) extending in the array direction of each of the light-emission elements 10. The sealing section 71 has a height higher than the height of each of the light-emission elements 10, and has a breadth (a width in a short-side direction) wider than the width of each of the light-emission elements 10. The sealing section 71 in itself has a size of, for example, 1 mm or less. The sealing section 71 is shaped like a flake. The sealing section 71 has an aspect ratio (maximum height/maximum breadth) that is small to the extent that the light-emission unit 1 is not set to be in a landscape orientation when the light-emission unit 1 is transferred, and this aspect ratio is, for example, ⅕ or less.

The sealing section 71 has, for example, an opening 71A at a position immediately above each of the light-emission elements 10, as illustrated in FIG. 12A. At least the second electrode 15 is exposed at the bottom of each of the openings 71A. In addition, the sealing section 71 also has, for example, an opening at a position immediately below each of the light-emission elements 10, and, for example, the pad electrode 17 (the first electrode 14 in some cases) is exposed at the bottom thereof.

The pad electrode 17 (or the first electrode 14) is coupled to the terminal electrode 61 with a predetermined conductive member (for example, solder, or metal plating) interposed therebetween. On the other hand, the second electrode 15 is coupled to the terminal electrode 62 with a bump 63 and a joint 64, which are illustrated in FIG. 12A, interposed therebetween. The bump 63 is a columnar conductive member embedded in the sealing section 71, and the joint 64 is a strip-shaped conductive member formed on a top surface of the sealing section 71. It is to be noted that the second electrode 15 may be coupled to the terminal electrode 62 with a conductive member interposed therebetween other than the bump 63 and the joint 64. The terminal electrodes 61 and 62 include, for example, principally Cu (copper). The terminal electrodes 61 and 62 may each have a surface partially coated with a material resistant to oxidizing, such as Au (gold).

In the present modification example, the plurality of light-emission elements 10 are mounted in the sealing section 71. Hence, besides exerting the effect of the above-described first embodiment, it is possible to fabricate the light-emission unit 5 at a low cost, and there is exerted, for example, an effect of easily ensuring positional accuracy when the light-emission unit 5 is used as a display pixel of a display.

6. Modification Example 2

FIG. 13A illustrates a plane configuration of a light-emission unit (a light-emission unit 6) according to the modification example 2 of the disclosure, and FIG. 13B illustrates an example of a cross-sectional configuration taken along III-III and seen from an arrow direction of the light-emission unit 6 illustrated in FIG. 13A. The light-emission unit 6 is, for example, suitably applicable as a display pixel of a display, which is a so-called LED display, or as a printer head, as with the above-described modification example 1. The light-emission unit 6 of the present modification example is different from the above-described modification example 1 in that each of light-shielding sections 75 is provided between the plurality of light-emission elements 10 mounted in the sealing section 71. It is to be noted that, here, the support section 24 illustrated on the peripheral edge of the holding section 20 in figures including FIG. 1 is omitted.

The light-shielding section 75 is provided to prevent a region of the adjacent light-emission element 10 from emitting light because of the light-condensing section 72 provided for each of the light-emission elements 10, in a case where the plurality of light-emission elements 10 mounted in the sealing section 71 are individually lighted. The light-shielding section 75 may only be able to prevent light from entering the region of the adjacent light-emission element 10. Preferably, the light-shielding section 75 is formed using, for example, a material having light reflecting characteristics, but may be formed using a light-absorbing material. Specific examples of the material include resin materials used in general for black matrix, and metallic materials such as tungsten (W).

In the present modification example, each of the light-shielding sections 75 is provided between the plurality of light-emission elements 10 mounted in the sealing section 71. This makes it possible to prevent unintentional lighting in an adjacent light emission region, when the light-emission elements 10 mounted in the light-emission unit 6 are individually lighted.

It is to be noted that in the above-described modification examples 1 and 2, the plurality of light-emission elements 10 mounted in each of the light-emission units 5 and 6 may be light-emission elements that emit pieces of light of the same wavelength band, or may be a combination of light-emission elements (R, G, B) that emit light of wavelength bands different from each other (for example, light of a red color band, a green color band, and a blue color band).

7. Application Examples

Application examples of the light-emission units 1 to 6 described in the first to fourth embodiments as well as the modification examples 1 and 2 are described below. The light-emission units 1 to 6 of the embodiments and the modification examples described above are each applicable to a display or illumination unit including the light-emission unit as a display pixel. Examples of such application are described below.

Application Example 1

FIG. 14 perspectively illustrates an example of a schematic configuration of a display 7. The display 7 is a so-called LED display, and an LED is used as a display pixel. For example, as illustrated in FIG. 14, the display 7 includes a display panel 310 and a drive circuit (not illustrated) that drives the display panel 310.

The display panel 310 is a panel in which a mounting substrate 320 and a transparent substrate 330 are stacked. The transparent substrate 330 has a surface serving as an image display surface, and includes a display region 7A on a middle portion thereof and a frame region 7B as a surrounding non-display region.

FIG. 15 illustrates an example of a layout of a region, which corresponds to the display region 7A, of a surface on the transparent substrate 330 side of the mounting substrate 320. For example, as illustrated in FIG. 15, a plurality of data wiring lines 321 extending in a predetermined direction are formed in the region, which corresponds to the display region 7A, of the surface of the mounting substrate 320, and are arranged in parallel with each other with a predetermined pitch. In the region, which corresponds to the display region 7A, of the surface of the mounting substrate 320, for example, a plurality of scan wiring lines 322 are further formed to extend in a direction intersecting (for example, orthogonal to) the data wiring lines 321, and are arranged in parallel with each other with a predetermined pitch. The data wiring lines 321 and the scan wiring lines 322 include, for example, a conductive material such as Cu (copper).

The scan wiring lines 322 are formed, for example, in an outermost layer, and are formed, for example on an insulating layer (not illustrated) formed on a base material surface. It is to be noted that the base material of the mounting substrate 320 is, for example, a glass substrate or a substrate such as a resin substrate, and the insulating layer on the base material is made of SiN, $SiO_2$, or $Al_2O_3$. Meanwhile, the data wiring lines 321 are formed within a layer (for example, a layer lower than the outermost layer) different from the outermost layer including the scan wiring lines 322, and is formed, for example, within the insulating layer on the base material. In addition to the scan wiring lines 322, for example, black is provided on the surface of the insulating layer as necessary. The black is provided to enhance contrast, and includes a material having a light absorption property. The black is formed, for example, in at least a region, in which pad electrodes 321B and 322B described later are not formed, of the surface of the insulating layer. It is to be noted that it is possible to omit the black as necessary.

A display pixel 323 is present in proximity to an intersection portion between the data wiring line 321 and the scan wiring line 322, and a plurality of display pixels 323 are arranged in a matrix within the display region 7A. For example, the light-emission unit 5 including the plurality of light-emission elements 10 is implemented in each of the display pixels 323. It is to be noted that FIG. 15 exemplifies a case where the one display pixel 323 includes the three light-emission elements 10 (10R, 10G, and 10B) in a manner in which the light-emission element 10R outputs red light, the light-emission element 10B outputs blue light, and the light-emission element 10G outputs green light.

The light-emission units 1 to 6 are each provided with the pair of terminal electrodes 61 and 62 for each of the light-emission elements 10 (10R, 10G, and 10B). The one terminal electrode 61 is electrically coupled to the data wiring line 321, and the other terminal electrode 62 is electrically coupled to the scan wiring line 322. For example, the terminal electrode 61 is electrically coupled to the pad electrode 321B at a front end of a branch 321A provided in the data wiring line 321. Further, for example, the terminal electrode 62 is electrically coupled to the pad electrode 322B at a front end of a branch 322A provided in the scan wiring line 322.

The pad electrodes 321B and 322B are each formed, for example, in the outermost layer, and provided at a portion where each of the light-emission units 1 to 6 is mounted, as illustrated in FIG. 15, for example. Here, the pad electrodes 321B and 322B are made of, for example, a conductive material such as Au (gold).

The mounting substrate 320 is further provided with, for example, a plurality of supports (not illustrated) that regulate a distance between the mounting substrate 320 and the transparent substrate 330. The supports may be provided within a region facing the display region 7A, or may be provided within a region facing the frame region 7B.

The transparent substrate 330 includes, for example, a glass substrate, or a substrate such as a resin substrate. In the transparent substrate 330, a surface on the light-emission units 1 to 6 side may be flat, but is preferably a rough surface. The rough surface may be provided over the entire region facing the display region 7A, or provided only a region facing the display pixel 323. The rough surface has irregularities which are small to the extent that, when pieces of light emitted from the light-emission elements 10 (10R, 10G, and 10B) enter the rough surface, the entering pieces of light diffuse. It is possible to form the irregularities of the rough surface by, for example, sandblast or a process such as dry etching.

The drive circuit drives each of the display pixels 323 (each of the light-emission units 1 to 6) on the basis of an image signal. The drive circuit includes, for example, a data driver that drives the data wiring line 321 coupled to the display pixel 323, and a scan driver that drives the scan wiring line 322 coupled to the display pixel 323. The drive circuit may be, for example, mounted on the mounting substrate 320, or may be provided separately from the display panel 310 and coupled to the mounting substrate 320 through a wiring line (not illustrated).

FIG. 16A and FIG. 16B illustrate a plane configuration (FIG. 16A) and a configuration in a perspective direction (FIG. 16B), respectively, of the illumination unit 8 that is another example of the illumination unit using the light-emission element 10. As illustrated in FIG. 16A and FIG. 16B, for example, the eight light-emission elements 10 are disposed on a mounting stage (a mounting substrate) having a ring shape.

FIG. 17A and FIG. 17B illustrate a plane configuration (FIG. 17A) and a configuration in a perspective direction (FIG. 17B), respectively, of an illumination unit 9 that is another example of the illumination unit using the light-emission element 10. As illustrated in FIG. 17A and FIG. 17B, for example, the nine light-emission elements 10 are disposed on a mounted stage (a mounting substrate) having a rectangular shape. This illumination unit 9 may include a ceiling light cover.

8. Examples

Next, examples of the disclosure are described.
(Verification 1)

First, a light-emission unit corresponding to the light-emission unit 1 in the above-described first embodiment was fabricated as an example 1. In the example 1, the thickness of the sealing section 21 was 6 mm in the Y-axis direction, and the sealing section 21 and the light-condensing section 22 were formed using a resin material having a refractive index of 1.49. The angle θ of the sloping surface of each of the projections 23 forming the light-condensing section 22 was 45 degrees. In addition, an ordinary light-emission unit not having the light-condensing section 22 was fabricated as a comparative example 1, and light distribution properties in the example 1 and the comparative example 1 were calculated (FIG. 18).

From FIG. 18, it was found that, in the example 1 in which the light-condensing section 22 was provided on the back face of the light-emission element 10, the front luminance was increased by approximately 100 times that of the comparative example 1, as indicated by the arrow therein. This is presumably due to refraction or reflection of the light emitted from the light-emission element 10 at the sloping surface S4 of the light-condensing section 22 toward the frontward direction as illustrated in FIG. 19.
(Verification 2)

Further, a light-emission unit in which the surface of the light-condensing section 22 was subjected to mirror coating (a reflectance of 95%) was fabricated as a comparative example 2, and the light distribution properties were calculated. The result of this calculation was compared with the example 1 (FIG. 20).

As illustrated in FIG. 20, in the comparative example 2 in which the surface of the light-condensing section 22 was subjected to mirror coating, an enhancement of luminance in the frontward direction as in the example 1 was not confirmed. This is presumably due to light reflected at the sloping surface S4 toward the frontward direction being limited to only a component of a portion of light entering the sloping surface S4 by subjecting the surface of the light-condensing section 22 to mirror coating as illustrated in FIG. 21. In view of this, it was found that the surface (in particular, the sloping surface S4) of the light-condensing section 22 was desirably flat and transparent.

(Verification 3)

Next, to examine an optimal angle (a prism base angle) of the sloping surface S4, examples 2 and 3 were fabricated using a resin material having a refractive index of 1.49 (the example 2) and a resin material having a refractive index of 1.59 (the example 3), respectively, for the holding section 20. In each of the examples 2 and 3, the pitch of the projection 23 was 2 mm, and the side surface on the light-emission element 10 side was at 90 degrees. Changes in the thickness of the sealing section 21 and the front luminance with respect to the prism base angle of the light-condensing section 22 were simulated. FIG. 22A and FIG. 22B illustrate a surface-luminance-ratio relationship of the example 2 and that of the example 3, respectively, with the comparative example 1. From FIG. 22A and FIG. 22B, it was found that, regardless of the refractive index of the resin material included in the holding section 20, the front luminance was maximum when the prism base angle of the light-condensing section 22 was around 45 degrees. Further, FIG. 23A and FIG. 23B illustrate an enlarged prism base angle range of 40 degrees to 50 degrees in FIG. 22A and that in FIG. 22B, respectively. It was found that, although an optimal value varied depending on the resin material included in the holding section, the front luminance greatly decreased at around 50 degrees. It was therefore found that the prism base angle of the light-condensing section 22 was preferably 40 degrees or more and 50 degrees or less, and the effect thereof was maximized at around 45 degrees. It is to be noted that, here, the results were obtained by calculations in a case where the light-emission element was disposed at the central position of the holding section 20. Hence, the range of the prism base angle of the light-condensing section 22 is not necessarily limited to the above-described values.

(Verification 4)

Subsequently, a light-emission unit, in which a reflection member causing specular reflection was provided on the back face of the sealing section 21, was fabricated as an example 4 corresponding to the light-emission unit 2 in the above-described second embodiment. In the example 4, the thickness of the sealing section 21 was 6 mm in the Y-axis direction, and the sealing section 21 and the light-condensing section 22 were formed using a resin material having a refractive index of 1.49. The angle θ of the sloping surface of each of the projections 23 forming the light-condensing section 22 was 45 degrees. In addition, a light-emission unit, in which a reflection member causing diffusion reflection was provided on the back face of the sealing section 21, was fabricated as a comparative example 3. The front luminance was calculated in each of the example 4 and the comparative example 3. FIG. 24 illustrates a result of calculating a front luminance ratio of each of the example 4 and the comparative example 3 in a case where the example 1 was a reference (1).

From FIG. 24, it was found that the front luminance ratio was enhanced as compared with the example 1, by disposing the reflection member 31 on the back face of the holding section 20. Further, it was found that it was possible to enhance the front luminance greatly by using, for example, a member subjected to mirror-like finishing with an element such as Al for the reflection member 31 than by using a member having a surface subjected to diffusion processing such as white coating.

(Verification 5)

Next, a light-emission unit, in which the antireflection film 41 was provided on the surface of the light-condensing section 22, was fabricated as an example 5 corresponding to the light-emission unit 3 in the above-described third embodiment. In the example 5, the thickness of the sealing section 21 was 6 mm in the Y-axis direction, and the sealing section 21 and the light-condensing section 22 were formed using a resin material having a refractive index of 1.49. The angle θ of the sloping surface of each of the projections 23 forming the light-condensing section 22 was 45 degrees. The front luminance in this example 5 was calculated, and the front luminance in a case where the example 1 was the reference (1) was compared in FIG. 25.

From FIG. 25, it was found that it was possible to enhance the front luminance by about 10% of the example 1, by forming the antireflection film 41 on the surface of the light-condensing section 22.

As described above, although the disclosure is described by referring to the first to fourth embodiments as well as the modification examples 1 and 2, the disclosure is not limited to these embodiments and the like, and various alterations are possible. For example, in the above-described embodiments and the like, although the description is provided using the LED as the light-emission element 10, this is not limitative. For example, in a case where an organic EL light-emission element or a light such as a fluorescent light is used, a similar effect is obtained.

It is to be noted that the effects described herein are mere examples and non-limiting, and other effects may also be provided.

It is to be noted that the disclosure may adopt the following configurations.

(1)

A light-emission unit including:

a light-emission section;

a light extraction surface that extracts light emitted from the light-emission section; and a light-condensing section that is provided on side opposite the light extraction surface, with the light-emission section provided therebetween.

(2)

The light-emission unit according to (1), in which 2 the light-condensing section has at least one projection and is provided at least at a portion of a periphery of the light-emission section.

(3)

The light-emission unit according to (2), in which the projection has a sloping surface or curved surface facing the light-emission section.

(4)

The light-emission unit according to (2) or (3), in which the light-condensing section includes a plurality of the projections concentrically provided around the light-emission section.

(5)

The light-emission unit according to any one of (2) to (4), in which the light-condensing section includes an antireflection film on a surface of the projection.

(6)

The light-emission unit according to any one of (1) to (5), including a reflection member that is provided on an outer side of the light-condensing section provided opposite the light extraction surface.

(7)

The light-emission unit according to any one of (1) to (6), in which the light-emission section is placed on a holding section, and the light-condensing section is provided in the holding section.

(8)

The light-emission unit according to (7), in which in the holding section, the light-condensing section is provided on a surface opposite a surface on which the light-emission section is placed.

(9)

The light-emission unit according to (7) or (8), in which the holding section is formed by a sealing resin, and the light-emission section is sealed by the sealing resin.

(10)

The light-emission unit according to any one of (7) to (9), in which a plurality of the light-emission sections are placed in the holding section, and the light-condensing section is provided for each of light-emission elements.

(11)

A display including:

a display panel that includes a plurality of light-emission units; and a drive circuit that drives the light-emission units on the basis of an image signal, wherein the light-emission units each include a light-emission section, a light extraction surface that extracts light outputted from the light-emission section, and a light-condensing section that is provided on side opposite the light extraction surface, with the light-emission section provided therebetween.

This application is based upon and claims priority from Japanese Patent Application No. 2015-247658 filed with the Japan Patent Office on Dec. 18, 2015, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A light-emission unit, comprising:

a light-emission section;

a light extraction surface configured to extract light outputted from the light-emission section; and a light-condensing section on a side opposite the light extraction surface, wherein the light-emission section is between the light extraction surface and the light-condensing section, the light-condensing section comprises at least one projection, and the projection has a sloped surface or curved surface that faces the light-emission section.

2. The light-emission unit according to claim 1, wherein the light-condensing section at least at a portion of a periphery of the light-emission section.

3. The light-emission unit according to claim 1, wherein the light-condensing section includes a plurality of projections concentrically provided around the light-emission section, wherein the plurality of projections include the at least one projection.

4. The light-emission unit according to claim 1, wherein the light-condensing section includes an antireflection film on a surface of the projection.

5. The light-emission unit according to claim 1, wherein the light-emission section is placed on a holding section, and the light-condensing section is in the holding section.

6. The light-emission unit according to claim 5, wherein in the holding section, the light-condensing section is on a surface opposite a surface on which the light-emission section is placed.

7. The light-emission unit according to claim 5, wherein the holding section includes a sealing resin, and the light-emission section is sealed by the sealing resin.

8. The light-emission unit according to claim 5, further comprising a plurality of light-emission sections placed in the holding section, and the light-condensing section is provided for each of light-emission elements, wherein the plurality of light-emission sections include the light-emission section.

9. A display, comprising:

a display panel that includes a plurality of light-emission units; and a drive circuit configured to drive the plurality of light-emission units based on an image signal, wherein each of the plurality of light-emission units includes:

a light-emission section, a light extraction surface configured to extract light outputted from the light-emission section, and a light-condensing section on a side opposite the light extraction surface, wherein the light-emission section is between the light extraction surface and the light-condensing section, the light-condensing section comprises at least one projection, and the projection has a slope surface or curved surface that faces the light-emission section.

10. A light-emission unit, comprising:

a light-emission section;

a light extraction surface configured to extract light outputted from the light-emission section;

a light-condensing section on a side opposite the light extraction surface, wherein the light-emission section is between the light extraction surface and the light-condensing section; and a reflection member on an outer side of the light-condensing section, wherein the reflection member is opposite the light extraction surface.

* * * * *